United States Patent [19]

Abrokwah et al.

[11] Patent Number: 4,814,851
[45] Date of Patent: Mar. 21, 1989

[54] HIGH TRANSCONDUCTANCE COMPLEMENTARY (AL,GA)AS/GAS HETEROSTRUCTURE INSULATED GATE FIELD-EFFECT TRANSISTOR

[75] Inventors: Jonathan K. Abrokwah, Rosemount; Nicholas C. Cirillo, Jr., Minneapolis; Michael S. Shur, Golden Valley; Obert N. Tufte, Prior Lake, all of Minn.

[73] Assignee: Honeywell Inc., Minneapolis, Minn.

[21] Appl. No.: 188,069

[22] Filed: Apr. 28, 1988

Related U.S. Application Data

[63] Continuation of Ser. No. 73,368, Jul. 6, 1987, abandoned, which is a continuation of Ser. No. 747,501, Jun. 21, 1985, abandoned.

[51] Int. Cl.$^4$ ............................................ H01L 27/02
[52] U.S. Cl. ....................................... 357/42; 357/16; 357/22
[58] Field of Search .......... 357/42, 16, 22 A, 22 MD, 357/67, 15

[56] References Cited

U.S. PATENT DOCUMENTS

| | | | |
|---|---|---|---|
| 4,268,844 | 5/1981 | Meiners | 357/67 |
| 4,556,895 | 12/1985 | Ohata | 357/16 |
| 4,566,021 | 1/1986 | Yokoyama | 357/67 |
| 4,603,469 | 8/1986 | Armiento | 357/42 |

FOREIGN PATENT DOCUMENTS

| | | |
|---|---|---|
| 0143656 | 11/1984 | European Pat. Off. . |
| 0165798 | 6/1985 | European Pat. Off. . |
| 2913068 | 10/1980 | Fed. Rep. of Germany ........ 357/22 MD |
| 2913068 | 10/1980 | Fed. Rep. of Germany . |
| 58-147167 | 1/1983 | Japan . |
| 58-143572 | 8/1983 | Japan ............................ 357/22 MD |
| 59-171167 | 9/1984 | Japan ............................ 357/22 MD |

OTHER PUBLICATIONS

IEEE Electron Device Letters, Apr. 1984, pp. 129–131, by Cirillo et al.
Patent Abstracts of Japan, vol. 7, #161, Nov. 1983.
IBM Technical Disclosure Bulletin, vol. 27, No. 9, Feb. 85, pp. 5064–5066, J. Y. F. Tang et al., "GaAs Gate Field-Effect Transistor Fabrication".
IEEE Transactions on Electron Devices, vol. ED-31, No. 11, Nov. '84, pp. 1662–1667, R. Dinge, "New High--Speed III-V Devices for Integrated Circuits".
Japanese Journal of Applied Physics, vol. 24, No. 5, May '85, pp. L335–L337, K. Oe et al., "A New p-Channel AlGaAs/GaAs MIS-Like Heterostructure FET Employing Two Dimensional Hole Gas".
Katayama et al., "A New Two-Dimensional Electron Gas Field-Effect Transistor Fabricated on Undoped AlGaAs–GaAs Heterostructure", Jpn. J. Appl. Phys., vol. 23, L150-2 Mar. '84.
Solomon et al., "A GaAs Gate Heterojunction FET", IEEE Electron Device Letters, vol. 5, No. 9, Sep. '84, pp. 379–380.
Kiehl et al., "Complementary p–MODFET and n–HB MESFET (Al,Ga)As Transistors", IEEE Electron Device Letters, vol. EDL-5, No. 12, Dec. '84, pp. 521–523.
Kiehl et al., "Complementary p–MODFET and n–HB MESFET (Al,Ga)As Fets", IEDM '84, pp. 854–855.
Zuleeg et al., "Double-Implanted GaAs Complementary JFETs" IEEE Electron Device Letters, vol. EDL-5, No. 1, Jan. '84, pp. 21–23.

Primary Examiner—Andrew J. James
Assistant Examiner—Mark Prenty
Attorney, Agent, or Firm—Omund R. Dahle

[57] ABSTRACT

A complementary (Al,Ga)As/GaAs heterostructure insulated gate field-effect transistor (HIGFET) approach is described in which both the n-channel and p-channel transistors utilize a two-dimensional electron (hole) gas in undoped high mobility channels to form planar, complementary GaAs-based integrated circuits.

19 Claims, 4 Drawing Sheets

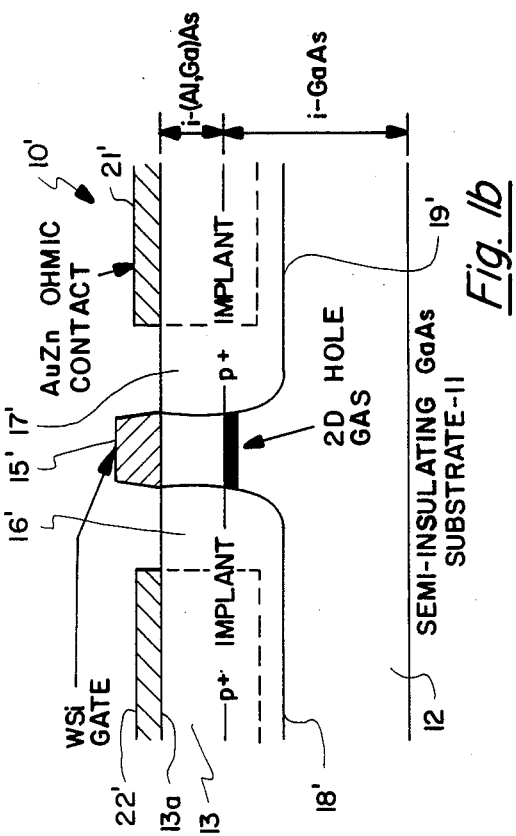
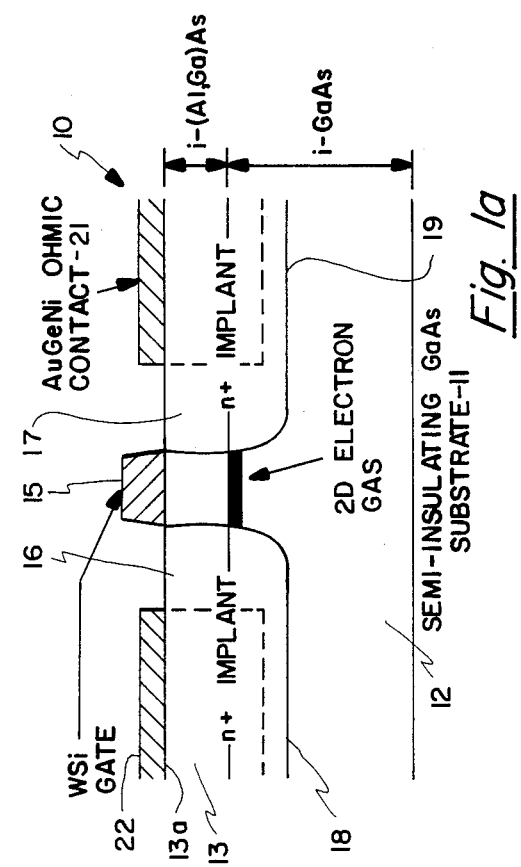
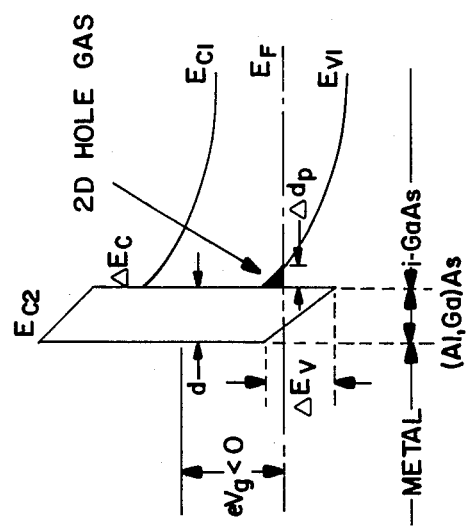
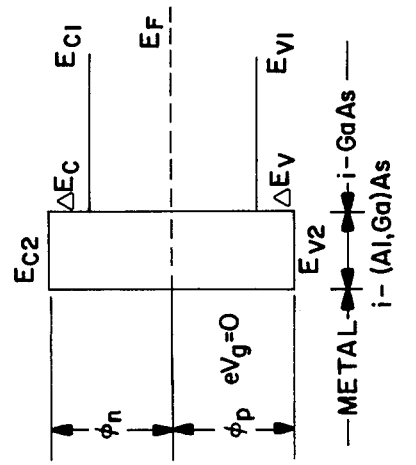
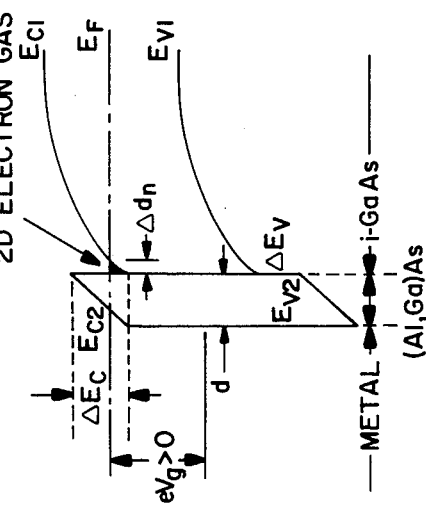

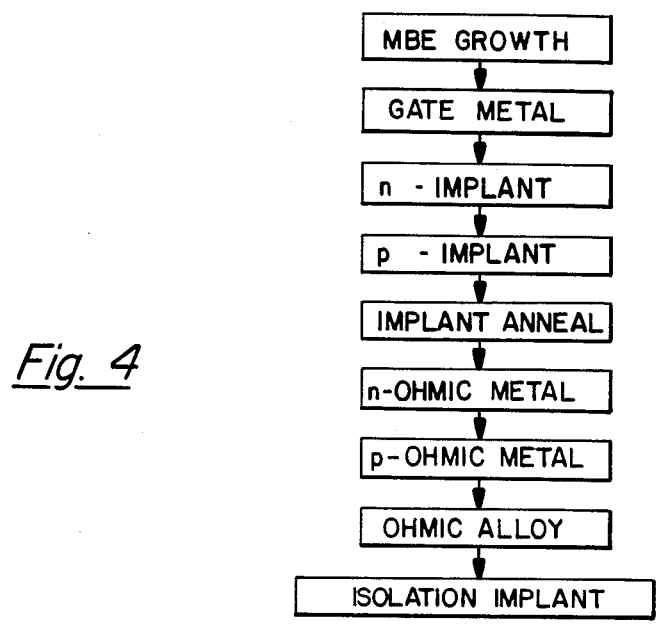
*Fig._4*
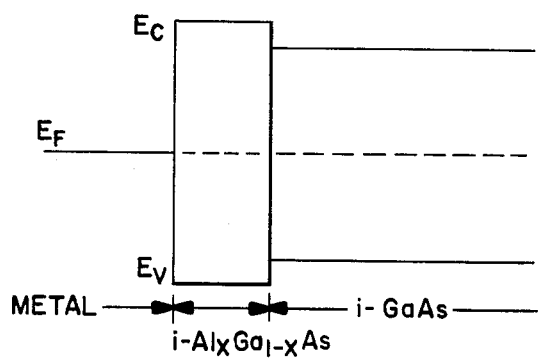
*Fig._5*
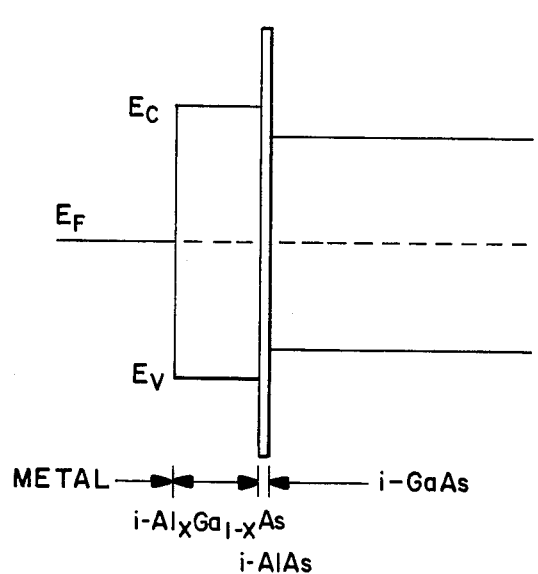

HIGH TRANSCONDUCTANCE COMPLEMENTARY (AL,GA)AS/GAS HETEROSTRUCTURE INSULATED GATE FIELD-EFFECT TRANSISTOR

This application is a continuation of application Ser. No. 073,368, filed July 6, 1987, and now abandoned, which itself is a continuation of Ser. No. 747,501, filed on June 21, 1985, and now abandoned.

BACKGROUND AND SUMMARY OF THE INVENTION

This invention is directed to the fabrication of n-channel and p-channel (Al,Ga)As Heterostructure Insulated Gate Field-Effect Transistors (HIGFETs) on a common planar wafer surface to form high performance GaAs based complementary integrated circuits. The heterostructure used for HIGFETs consists of an undoped GaAs buffer layer grown on a semi-insulating GaAs substrate followed by an undoped (Al,Ga)As gate layer. Both of these layers are epitaxially grown under conditions to make them as close to intrinsic and insulating as possible. Both the n- and p-channel HIGFETs utilize the high mobility, two-dimensional (2D) electron (hole) gas which is induced at the (Al,Ga)As-GaAs hetero-interface by the application of a suitable gate bias voltage. A self-aligned gate (SAG) process is used to form the source drain regions of the transistors with p+ implanted regions for p-channel and n+ implanted regions for n-channel HIGFETs. The electrons (holes) in the channel come from the source drain contacts when a suitable gate bias is applied. The use of undoped heterostructures allows both n- and p-channel transistors to be fabricated in the same epitaxial layers on the same wafer surface by a planar process. The absence of impurities also leads to high electron (hole) channel mobility resulting in FE operation in the saturation velocity regime for high transconductance transistors. Complementary GaAs based circuits which utilize both n- and p-channel transistors offer significant advantages over circuits utilizing only n-channel transistors in terms of noise margin and power dissipation and consequently circuit integration level.

The prior art has not taught this type of complementary planar structure in which both the n- and p-channel transistors utilize a 2D electron (hole) gas in an undoped high mobility channel. An article by Katayama et al, "A New Two-Dimensional Electron Gas Field-Effect Transistor Fabricated on Undoped AlGaAs-GaAs Heterostructure", Jpn. J. Appl. Phys., Vol. 23, L150-2, March 84, shows an n-channel device which utilizes an undoped AlGaAs gate and is a 2D electron gas field-effect transistor. It is not a complementary device. Solomon et al, "A GaAs Gate Heterojunction FET", IEEE Electron Device Letters, Vol. 5, No. 9, September 84, p 379-80, describe an n-channel heterostructure FET with an insulating gate but this also is not a complementary device. A different kind of complementary device is shown in an article by Kiehl et al, "Complementary p-MODFET and n-HB MESFET (Al,Ga)As Transistors", IEEE Electron Device Letters, Vol. EDL-5, No. 12, December '84, p 521-23. A similar disclosure is shown in Kiehl et al, "Complementary p-MODFET and n-HB MESFET (Al,Ga)As FET's", IEDM '84, p 854-55. Both of these publications describe a complementary device structure consisting of a conventional p-channel MODFET, made with a doped (Al,Ga)As gate and an n-channel MESFET. This is not a planar device and does not utilize a 2-dimensional electron and hole gas in an undoped high mobility channel for both the n- and p-channel devices. In the substantially different JFET technology, the fabrication of n-channel and p-channel GaAs-based devices on the same wafer has been disclosed, as for example by Zuleeg et al, "Double-Implanted GaAs Complementary JFET's", IEEE Electron Device Letters, Vol. EDL-5, No. 1, January 1984, p 21-23. J-FET devices do not utilize 2-dimensional electron (hole) gases in undoped, high mobility channels.

This subject matter herein is related to a copending application of Cirillo et al, Ser. No. 668,586 filed Nov. 5, 1984, titled "Self-aligned Gate Process for ICs based on Modulation Doped (Al,Ga)As/GaAs FETs", now U.S. Pat. No. 4,662,058 and assigned to the same assignee as the present invention. The self-aligned gate process of that application is also used in the present invention.

The HIGFET approach takes maximum advantage of the heterostructure technology to create two-dimensional (2D) gases of both electrons and holes in a planar undoped multilayer (Al,Ga)As/GaAs structure. The 2D, electron (hole) gas is created at the (Al,Ga)As/GaAs heterointerface by applying a positive (negatie) gate bias. The 2D electron (hole) gas has a high electron (hole) mobility because of the reduction of the impurity scattering. This allows FET operation in the velocity saturation regime at low voltages for high transconductance transistors. The SAG approach is essential for HIGFET devices since electrical contact must be made directly to the 2D high mobility electron and hole gases, which are present only under the gates. The planar structure of this invention is important to achieve the high processing yield required for VLSI circuits. The insulating gate approach for both the n- and p-channel devices allows a larger voltage swing on the input gates without leakage or shorting. The insulating gates also improve the threshold voltage uniformity and control since the threshold voltage is much less critically dependent on the thickness and doping of the gate layer than normal MODFET device structures.

BRIEF DESCRIPTION OF THE DRAWINGS

FIGS. 1a and 1b are schematics of the device cross section for a n-channel HIGFET and a p-channel HIGFET.

FIG. 2a shows the band structure at the point of establishing the 2D electron gas for the n-channel device of FIG. 1a; FIG. 2b shows the band structure at the point of establishing the 2D hole gas for the p-channel device of FIG. 1b; and FIG. 2c shows the band structure at zero bias of the normally off (non-conductive) enhancement type complementary devices.

FIG. 4 shows the processing steps for the complementary HIGFET fabrication.

FIG. 5 shows band structure of an alternate HIGFET device structure.

DESCRIPTION

Figure 3:
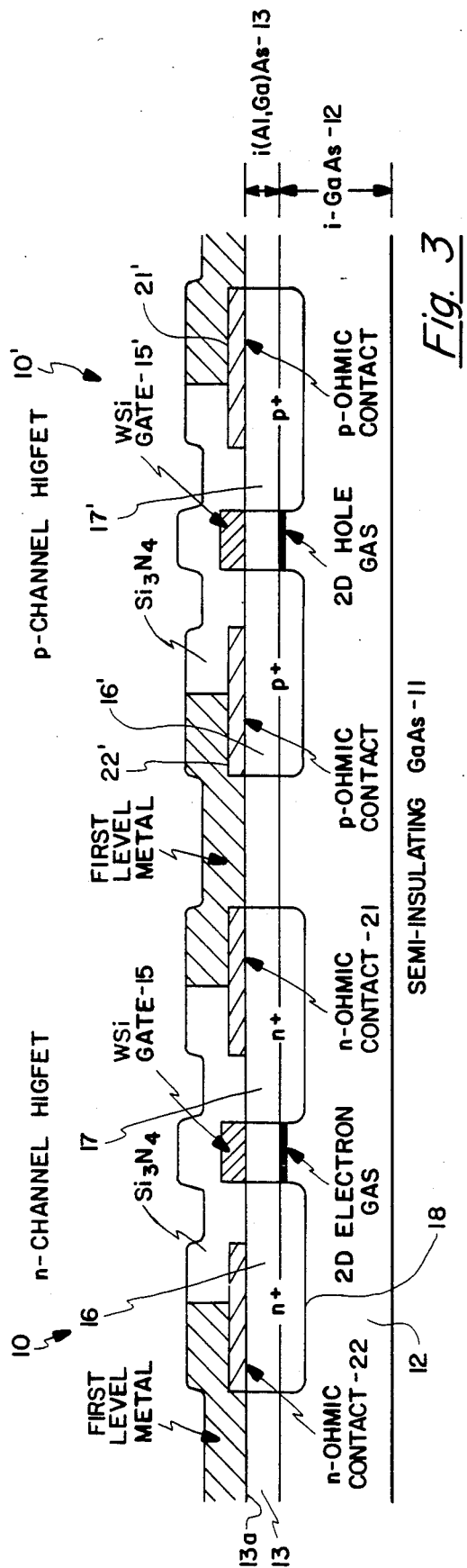
FIG. 3 shows the cross section of the complementary HIGFET inverter.

The HIGFET device approach is illustrated in FIGS. 1 and 2. FIG. 1 shows schematically a cross section view of n- and p-channel devices while FIG. 2 shows schematically the energy band diagrams for the HIGFET devices starting at the gate electrode 15 and going perpendicular to the wafer surface. The HIGFET utilizes two epitaxial layers 12 and 13 grown on a semi-insulating GaAs wafer 11. The first layer 12 is pure, undoped GaAs, which is grown under conditions to make it as close to intrinsic as possible. The second layer 13 is a pure and undoped layer of (Al,Ga)As, which is again grown under conditions to make it as close to intrinsic as possible.

The basic mechanisms which give rise to n-and p-channel HIGFETs are shown in FIG. 2. FIG. 2c shows the relative positions of the conduction and valence bands in the insulating GaAs layer, the insulating (Al,Ga)As layer and the position of the Fermi level of the metal gate electrode in a device without external electrical bias. The position of the Fermi level is shown to be midway between the conduction and valence bands of the GaAs and (Al,Ga)As layers for purposes of illustration and in practice the exact Fermi level position will depend on the amounts and types of residual impurities and defects in these undoped layers. Similarly, the gate metal Fermi level is shown midway between the conduction and valence bands of the (Al,Ga)As layer, but its actual position will depend on the work functions of the metal chosen and the position of the Fermi level at the surface of the (Al,Ga)As surface. In the unbiased state shown in FIG. 2c, a conducting channel does not exist under the gate, i.e. both the n- and p-channel complementary HIGFETs are normally-off enhancement devices. The 2D high mobility electron (n-channel) gas or hole (p-channel) gas is created at the (Al,Ga)As/GaAs heterointerface by applying a positive (or a negative) gate voltage between the gate and the source contact, thereby providing in effect a current channel or trough between source and drain implanted regions which act as electron (or hole) reservoirs. The source and drain regions are heavily doped by ion implantation and have Fermi levels near the conduction (valence) band edges. FIGS. 2a and 2b show bands with applied gate voltages. In FIG. 2a, a positive gate bias is applied and when $E_c$ crosses the Fermi level, $E_F$, a 2D electron gas is induced. Likewise in FIG. 2b a negative gate bias is applied and when $E_v$ crosses the Fermi level, $E_F$, a 2D hole gas is induced. The electrons (or holes) are provided by the n+ type (or p+ type) implanted regions, and the electron (or hole) density is controlled by the gate voltage. To first order, the threshold voltages of these devices are determined by the gate barrier height $\phi$ and the energy band discontinuities $\Delta E$:

$$V_{tn}=\phi_n-\Delta E_c,$$

$$V_{tp}=\phi_p+\Delta E_v.$$

The two-dimensional electron and hole gas densities, $n_s$ and $p_s$, respectively, are determined to first order by the relations:

$$n_s=\epsilon(V_g-V_{tn})/q(d+\Delta d_n)$$

$$p_s=\epsilon(-V_g+V_{tp})/q(d+\Delta d_p)$$

where d is the thickness of the (Al,Ga)As insulator, q is the electronic charge, and $\Delta d$ is the width of the 2D gases. The threshold voltage can be minimized and the two-dimensional electron and hole gas densities can be maximized by making $\Delta E_c$ and $\Delta E_g$ as large as possible. The magnitude of $\Delta E_c$ and $\Delta E_v$ both increase with the fraction x of Al in the $Al_xGa_{1-x}As$ layer. Consequently, the device physics favors as large an Al composition as possible, commensurate with the technical problems associated with using AlAs or near AlAs composition materials in devices. Grading of the composition of the i-AlGaAs layer between the i-GaAs interface and the surface may be desirable to minimize the problems associated with high Al compositions.

The structure and fabrication of our complementary n- and p-channel HIGFET will now be described. Referring to FIG. 1a there is shown first an n-channel portion of a planar complementary HIGFET device. A semi-insulating GaAs substrate wafer 11 has grown thereon by molecular beam epitaxy (MBE) an insulating GaAs (i-GaAs) layer 12. Then a insulating aluminum gallium arsenide (i-(Al,Ga)As) layer 13 is grown by MBE. Alternately, MOCVD could be used to form these epitaxial layers. On the epitaxial surface is fabricated a gate such as a WSi gate 15. The regions 16 and 17 on either side of the gate extending to the ohmic contact regions, as delineated by the lines 18 and 19 are high dose ion implanted with a donor n+ species, such as Si, the gate 15 preventing any of the ion implant beneath itself and so providing the self-aligned gate structure. An implant anneal is made and then metallic contacts 21 and 22 are deposited on the surface. In a preferred embodiment the metallization is AuGeNi-based. A conventional alloy heat treatment forms these contacts to the heavily implanted region as shown by the dashed lines.

Referring now to FIG. 1b there is shown in the second place a p-channel portion 10' of a planar complementary HIGFET device. The p-channel portion of FIG. 1b is the same substrate wafer 11 and is normally positioned adjacent the n-channel portion described above. The insulating layers 12 and 13 are the same layers identified as layers 12 and 13 of FIG. 1a. A WSi gate 15' is the same as in FIG. 1a. An acceptor p+ implant is made at regions 16' and 17' on either side of the metal silicide gate 15'. An implant anneal is made and then ohmic contacts 21' and 22' are deposited and alloyed to the high dose p-implanted region. In a preferred embodiment the metallization is AuZnAu-based.

In FIG. 3 a cross-section view of a planar complementary HIGFET inverter is shown using as far as possible the same identifying numerals as used in the individual sections FIG. 1a and 1b. The n-channel device 10 and the p-channel device 10' are both formed on the common semi-insulating GaAs substrate 11. Specifically, the GaAs substrate 11 has grown thereon by MBE an insulating (undoped) GaAs layer 12 and then an insulating (undoped) (Al,Ga)As layer 13. In FIG. 5 one example of an alternate fabrication which has been demonstrated shows a thin layer of i-AlAs between the i-GaAs and the i-(Al,Ga)As layers, where the i-AlAs layer is added to improve the insulating properties of the gate and to increase the valence and electron band energy discontinuities $\Delta E_c$ and $\Delta E_v$, which increases the electron (hole) concentrations in the channels. In other embodiments, the composition profile of the gate can be graded or include various composition sublayers to optimize the device performance.

Referring to FIG. 4, a flow chart of the planar self-aligned gate by ion implantation n-channel and p-channel HIGFET IC process for completing the complementary IC of FIG. 3 is illustrated. The first step listed is the MBE heterostructure growth of the i-GaAs layer 12 and the i-(Al,Ga)As layer 13. Growth conditions are adjusted to obtain as close to intrinsic semiconductor material as possible with very low total doping. Then on the epitaxial surface 13a a high temperature stability refractory metal or metal silicide such as $WSi_x$ is deposited to form the gates 15 and 15'. A double masking of the surface allows sequential n+ and p+ selective ion implants. The source and drain regions 16 and 17 on either side of the gate 15 extending to the ohmic contact regions, as delineated by lines 18 and 19, are ion implanted with an n-implant while the regions around gate 15' are covered. Then the regions 16' and 17' on either side of the gate 15' are ion implanted with a p+ implant while the regions of gate 15 are covered. In one embodiment Si was used to create the n+ implanted regions and Mg or Be have each been used to form the p+ implanted regions. These two ion implants provide the self-aligned gates, the gates 15 and 15' preventing any of the ion implant beneath itself and so providing the self-aligned gate structure. A high temperature implant anneal process is the next step to activate the ion implanted n and p species. This implant anneal can be in a conventional semiconductor anneal furnace, or rapid thermal annealing using an optical lamp can also be used. Dielectric anneal encapsulants, such as $Si_3N_4$ or an As-overpressure can be used to optimize the anneal activation. Alternate processes for forming self-aligned gate structures which utilize $SiO_2$ and photoresist to mask the gate region during ion implantation and deposit the actual metal gate after implant anneal can also be used.

The metallic drain and source electrodes 21, 22, 21' and 22' are deposited and delineated using standard photolithographic liftoff techniques. In one preferred embodiment this ohmic contact is AuGeNi-based for the n-channel HIGFET 10 and AuZnAu-based for the p-channel HIGFET 10'. Then a conventional alloy heat treatment is used so that ohmic contacts are formed to the heavily implanted regions as shown by the dashed lines of FIGS. 1a and 1b.

Figure 6:
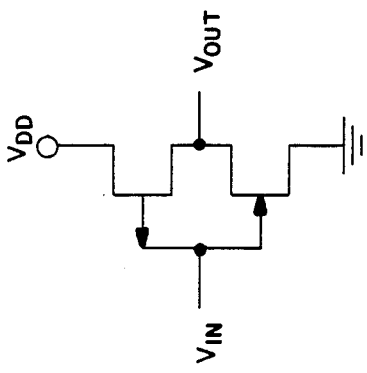
FIG. 6 is an electrical line schematic of the CMOS-like GaAs structure shown in FIG. 3.

The individual complementary devices such as 10 and 10' of FIG. 3 are electrically isolated one from the other by ion implantation of a neutral species, such as protons, which destroys any residual electrical conduction between the devices. A photoresist is used to protect the active devices during the isolation ion implant. The n-channel and p-channel HIGFET devices can then be connected to form standard complementary logic gates using a standard metal interconnect system as is shown in FIG. 3 to form gates such as the simple inverter shown schematically in FIG. 6.

Both n-channel and p-channel HIGFET devices have been fabricated and tested at both room temperature and 77° K. As shown in FIG. 5, two different (Al,GA)As/GaAs heterostructures have been grown for device fabrication. The first employs a homogeneous undoped $Al_{0.3}Ga_{0.7}$ layer as the gate insulator. The second incorporates an undoped AlAs layer next to the GaAs in an attempt to increase the conduction and valence band discontinuities, $\Delta E_c$ and $\Delta E_v$ respectively.

Figure 7:
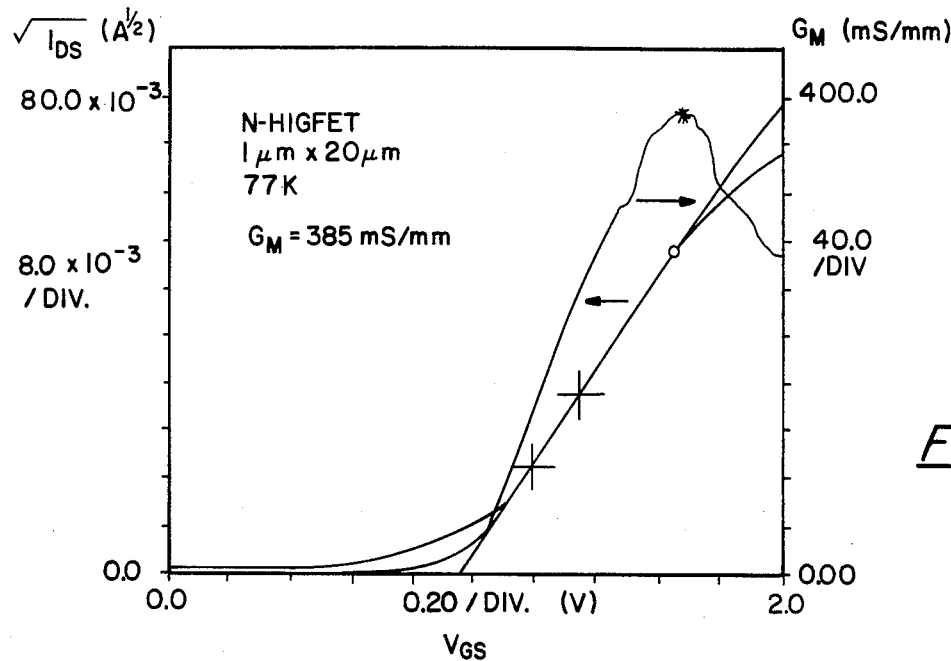
FIG. 7 is a graphical presentation of the transfer characteristics and transconductance of n-HIGFET at 77k.
Figure 8:
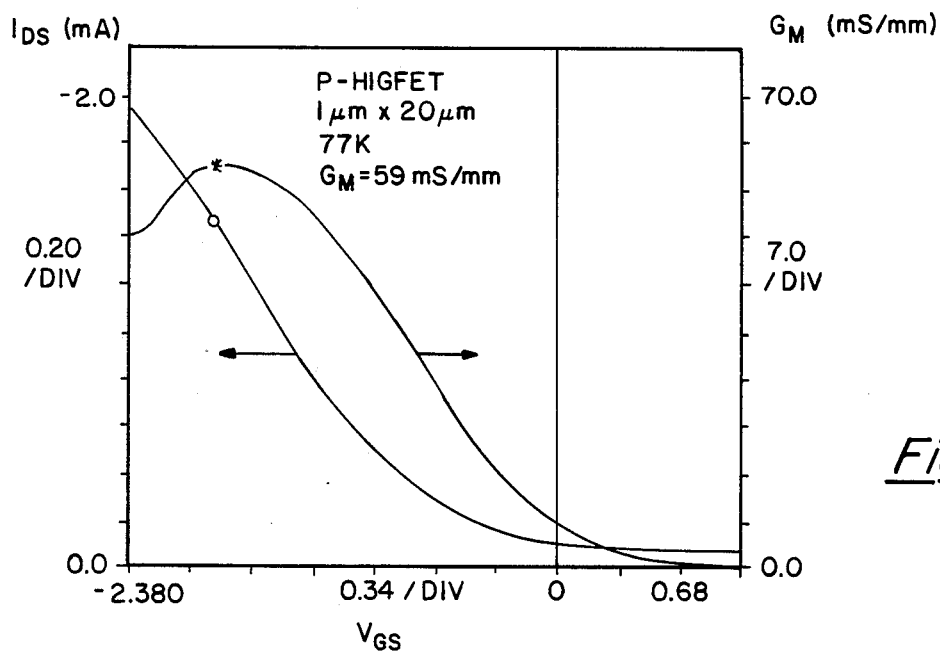
FIG. 8 is a graphical presentation of the transfer characteristics and transconductances of p-HIGFET at 77k.

For a nominal 1 $\mu$m gate length n-channel HIGFET, the extrinsic transconductance $g_m$ is 218 mS/mm at room temperature and 385 mS/mm at 77° K. FIG. 7 shows a plot of both the square-root of $I_{ds}$ and $g_m$ versus the gate-to-source voltage $V_{gs}$ for an n-channel device. For a nominal 1 $\mu$m gate length p-channel HIGFET the values of the extrinsic transconductance $g_m$ are 28.3 mS/mm at room temperature and 59.3 mS/mm at 77° K., respectively. FIG. 8 shows a plot of both the square root of $I_{ds}$ and $g_m$ versus the gate-to-source voltage $V_{gs}$ for a p-channel device. The specification has shown a complementary device based on (Al,Ga)As/GaAs material system, however the invention can clearly be applied to other semiconductor material systems such as (Al,In)As/(Ga,In)As, in which the gate material is a larger gap insulating semiconductor and the active channel material is a high mobility semiconductor.

The embodiments of the invention in which an exclusive property or right is claimed are defined as follows:

1. A complementary, planar heterostructure IC in which both the n-channel and p-channel transistors utilize a 2D electron (hole) gas in an undoped high mobility channel to form CMOS-like IC's, the complementary, planar IC structure comprising:
   semi-insulating compound semiconductor substrate means having a flat major surface;
   a first epitaxially grown layer of a first insulating III–V compound semiconductor over said surface, said insulating compound semiconductor layer having high mobility and having a first bandgap;
   a second epitaxially grown layer of a second insulating III–V compound semiconductor, which second insulating compound semiconductor has a larger bandgap than said first bandgap, and in which the energy gap difference is divided between valence and conduction bands, said second layer having a planar surface;
   first and second metal gate electrodes deposited directly on said surface of said second epitaxial layer, said epitaxial layers under said metal gate electrodes being undoped;
   a n+ source and a n+ drain region defined by selective donor ion implantation in said epitaxial grown layer structure next to said first gate electrode;
   a p+ source and p+ drain region defined by selective acceptor ion implantation in said epitaxial grown layer structure next to said second gate electrode;
   first and second n-ohmic contacts directly on said second layer surface and alloyed to said n-source and n-drain regions, respectively; and,
   third and fourth p-ohmic contacts directly on said second layer surface and alloyed to said p-source and p-drain regions, respectively.

2. The structure according to claim 1 in which the compound semiconductor substrate means is of semi-insulating GaAs.

3. The structure according to claim 2 in which the first epitaxially grown layer is undoped insulating-GaAs, and the second epitaxially grown layer is insulating (Al,Ga)As.

4. The structure according to claim 3 in which said metal gate electrodes are WSi.

5. The structure according to claim 3 in which said second donor ion implantation is of silicon ions.

6. The structure according to claim 3 in which said selective acceptor ion implantation is of Mg or Be ions.

7. The structure according to claim 3 in which said n-ohmic contacts are AuGeNi-based.

8. The structure according to claim 3 in which said p-ohmic contacts are AuZn-based.

9. A planar complementary GaAs based heterostructure integrated circuit structure having complementary self-aligned gate (Al,Ga)As/GaAs heterostructure devices with an insulating (Al,Ga)As (SAG) gate structure to form CMOS-like GaAs IC's the planar complementary IC structure comprising:

semi-insulating GaAs substrate means having a flat major surface;

a MBE grown layer of insulating-GaAs over said surface;

a MBE grown layer of insulating (Al,Ga)As over said layer of i-GaAs said layer of (Al,Ga)As having a planar surface;

first and second metal gate electrodes deposited directly on said surface of said i-(Al,Ga)As layer, said epitaxial layers under said metal gate electrodes being undoped;

a n+ source and a n+ drain defined by selective donor ion implantation in said MBE structure next to said first gate electrode;

a p+ source and a p+ drain region defined by selective acceptor ion implantation in said MBE structure next to said second gate electrode;

first and second n-ohmic contacts directly on said (Al,Ga)As planar surface and alloyed to said n-source and n-drain regions, respectivley; and, third and fourth p-ohmic contacts directly on said (Al,Ga)As planar surface and alloyed to said p-source and p-drain regions, respectively.

10. The structure according to claim 9 in which said metal used in said gate electrode is WSi.

11. The structure according to claim 9 in which said selective donor ion implantation is of silicon ions.

12. The structure according to claim 9 in which said selective acceptor ion implantation is of Mg or Be ions.

13. The structure according to claim 9 in which said n-ohmic contacts are AuGeNi-based.

14. The structure according to claim 9 in which said p-ohmic contacts are AuZn-based.

15. A planar complementary GaAs based heterostructure integrated circuit structure comprising:

semi-insulating GaAs substrate means having a flat major surface;

planar epitaxial grown III-V insulating layers over said flat major surface including at least a first grown i-GaAs layer and a final grown i-$Al_xGa_{1-x}As$ layer, said final grown layer having a planar surface;

first and second metal gate electrodes deposited directly on said planar surface of the final layer of said insulating layers, said epitaxial grown insulating layers under said metal gate electrodes being undoped;

a n+ source a n+ drain region in said epitaxial grown layer structure defined by selective donor ion implantation into said structure next to said first gate electrode;

a p+ source a p+ drain region in said structure defined by selective acceptor ion implantation into said epitaxial grown layer structure next to said second gate electrode;

first and second n-ohmic contacts directly on said final layer surface and alloyed to said n-source and n-drain regions, respectively; and, third and fourth p-ohmic contacts directly on said final layer surface and alloyed to said p-source and p-drain regions, respectively.

16. The structure according to claim 15 in which x, the composition of the (Al,Ga)As layer can be variable throughout the layer.

17. The structure according to claim 15 in which the composition x, of the $i-Al_xGa_{1-x}As$ layer, is 1 (i.e. AlAs).

18. A complementary, planar heterostructure IC in which both the n-channel and p-channel transistors utilize a 2D electron (hole) gas in an undoped high mobility channel to form CMOS-like IC's, the complementary, planar IC structure comprising:

semi-insulating compound semiconductor substrate means having a flat major surface;

planar epitaxial grown undoped III-V insulating layers over said flat major surface including a first epitaxially grown layer of a first undoped compound semiconductor over said surface, said undoped compound semiconductor layer having high mobility and having a first bandgap, and a second epitaxially grown layer of a second undoped compound semiconductor, which second undoped compound semiconductor has a larger bandgap than said first bandgap, and in which the energy gap difference is divided between valence and conduction bands said second layer having a planar surface;

first and second metal gate electrodes deposited directly on said surface of said second undoped epitaxial layers, said epitaxial grown undoped insulating layers under said metal gate electrodes being undoped whereby there is no doped layers beneath said metal gate electrodes;

a n+ source a n+ drain region defined by selective donor ion implantation in said epitaxial grown layer structure next to said first gate electrode;

a p+ source and a p+ drain region defined by selective acceptor ion implantation in said epitaxial grown layer structure next to said second gate electrode;

first and second n-ohmic contacts directly on said second layer surface and alloyed to said n-source and n-drain regions, respectively; and, third and fourth p-ohmic contact directly on said second layer surface and alloyed to said p-source and p-drain regions, respectively.

19. The complementary, planar heterostructure IC according to claim 18 in which said first undoped compound semiconductor is i-GaAs and said second undoped compound semiconductor is i-AlGaAs.

* * * * *